United States Patent [19]

Maldonado

[11] Patent Number: 4,964,145
[45] Date of Patent: Oct. 16, 1990

[54] SYSTEM FOR MAGNIFICATION CORRECTION OF CONDUCTIVE X-RAY LITHOGRAPHY MASK SUBSTRATES

[75] Inventor: Juan R. Maldonado, Chappaqua, N.Y.

[73] Assignee: International Business Machines Corporation, Armonk, N.Y.

[21] Appl. No.: 383,519

[22] Filed: Jul. 24, 1989

[51] Int. Cl.⁵ .............................................. G21K 5/00
[52] U.S. Cl. .......................................... 378/35; 430/5
[58] Field of Search ........................ 378/34, 35; 430/5

[56] References Cited

U.S. PATENT DOCUMENTS 4,887,283 12/1989 Hosono ................................. 378/35

Primary Examiner—Craig E. Church
Attorney, Agent, or Firm—Sughrue, Mion, Zinn, Macpeak & Seas

[57] ABSTRACT

A thin film structure for correcting magnification errors in X-ray lithography. On a conductive substrate a low dielectric constant thin film is deposited. A piezoelectric film is deposited on the low dielectric constant thin film. An electrode array is positioned on the piezoelectric film to provide a relatively uniform electric field across the electrode array. The structure may be oriented around or in the X-ray exposure area. If located outside it may be orthogonally or circularly placed about the exposure area.

20 Claims, 1 Drawing Sheet

SYSTEM FOR MAGNIFICATION CORRECTION OF CONDUCTIVE X-RAY LITHOGRAPHY MASK SUBSTRATES

BACKGROUND OF THE INVENTION

This invention is directed to a system for correcting induced wafer magnification errors which could cause potential mis-registration between lithographic levels in the fabrication of a semiconductor device. In particular, this invention employs the application of transverse electric fields to control the dimensions of a piezoelectric film which is deposited on a conductive X-ray lithography mask substrate.

In the manufacture of semiconductor devices, X-ray lithography has been pursued as a technique of choice for devices having submicron line widths. The lithography technique replicates a desired pattern from masks to various layers deposited on a semiconductor wafer. Different masks are used in different processing steps of the wafer. Given the extreme dimensional requirements (submicron) it is therefore of critical importance that the alignment of each mask relative to the wafer be held within very tightly controlled tolerances.

As an example of the type of errors which occur, are process induced wafer magnification errors. These errors can cause a mis-registration between various lithographic levels, that is between the wafer and various masks. The control of mask alignment is an important parameter in reducing such errors. It has been proposed to use piezoelectric thin films deposited on the X-ray substrate to achieve mask to registration registration by the use of applied electric fields. To achieve directional control of the dimensions of a piezoelectric thin film, fields which are applied along the plane of substrate (transverse) are considered advantageous. This is because when the fields are applied longitudinally (i.e., through the thickness of the film). the transverse dimensional change in the plane is a function of the film's crystalline structure. That is, the change may in some cases be isotropic for amorphous or a polycrystalline materials. Additionally, the transverse dimensional change is reduced in magnitude as a function of the materials Poisson's ratio.

Thus, the use of transverse electric fields is preferable for piezoelectric films deposited on a dielectric mask substrate. In the case of piezoelectric films deposited on conductive substrates, the transverse fields are non-uniform. This is because of the large voltage drop between the top and bottom of the film when combined with the presence of an equipotential bottom surface. To minimize the radiation damage effects, electrically conductive mask substrates may be required. Within existing technology there is no acceptable technique which uses a transverse electric field to control piezoelectric films to correct for magnification errors in the case of electrically conductive substrates.

Within the art a variety of other techniques have been proposed to achieve alignment of lithography masks. However, none deals specifically with the use of piezoelectric thin films as a technique of correcting for magnification errors. For example. U.S. Pat. No. 4,694,477 employs X-ray lithography masks. Positioning is by piezoelectric transducers which are positioned external to the masks. Thus in accordance with this proposal the masks and frame are attached to a stage plate which has six degrees of freedom. Positioning of the plate is by use of piezoelectric transducers. While the mask is aligned there is no dimensional control of the mask itself.

Other techniques to align a photocathode mask by the use of piezoelectric techniques are disclosed in U.S. Pat. No. 3,887,811. In contrast to the technique employed in the '477 patent, U.S. Pat. No. 3,887,881 provides angular alignment by the use of piezoelectric elements that cause relative rotation between the photocathode mask and the wafer. Thus, mask rotation occurs by the use of an externally generated force such that physical movement occurs.

Dimensional control by use of temperature change is disclosed in U.S. Pat. No. 4,256,829 and EPO No. 054 641. In the '829 patent the substrate and masks errors are adjusted by local temperature change to account for any planar dimensional distortion which will exist between various processing steps. In the EP-641 disclosure a shadow mask is constructed having a series of through-holes or vias. The mask and wafer are thus deliberately constructed in mis-registration at room temperature but the vias will be aligned when the mask reaches its working temperature. Misalignment is compensated by anticipating the difference in thermal expansion between the mask and wafer. Should there be a variation in pre-calculation temperatures then, registration will not be achieved.

SUMMARY OF THE INVENTION

Given these deficiencies, it is an object of this invention to provide a system that corrects for magnification errors associated with X-ray masks.

Yet another object of this invention is to define a thin film structure which uses transverse electric fields to control piezoelectric films that correct for magnification errors.

A further object of this invention is to provide for an interdigital electrode which is deposited in a piezoelectric film to provide for a technique of applying a transverse electric field that corrects for magnification errors in an X-ray lithography structure.

These and other objects of this invention are accomplished by means of a composite structure comprising a relative low dielectric constant thin film deposited on a conductive substrate prior to the deposition of a high dielectric constant piezoelectric film. The purpose of the low dielectric constant film is to provide a low voltage drop through the thickness of the high dielectric constant piezoelectric material. Secondarily, this low dielectric constant film isolates the bottom of the piezoelectric film from the conductive substrate. This allows a relatively uniform electric field to be achieved across the interdigital gap inside the piezoelectric film.

Further, in accordance with this invention, an interdigital electrode array is deposited on the piezoelectric film.

In a first embodiment of this invention, the piezoelectric films and electrodes are placed either on top, the bottom or both of the membrane in a position remote from the X-ray exposure area. The electrode arrays may be oriented orthogonal to each other to permit x-y magnification correction. Additionally, the electrode arrays may be placed in a circle around the exposure area.

In a second embodiment, the interdigital electrodes having a low X-ray absorption are placed in the X-ray exposure area to enhance the dimensional image. By placing electrodes directly in the exposure area, it is possible to independently adjust sections of the substrate using an appropriately addressed electrode array.

This invention will be described in greater detail by referring to the attached drawing and description of the preferred embodiments that follows.

DESCRIPTION OF THE PREFERRED EMBODIMENTS

Figure 1:
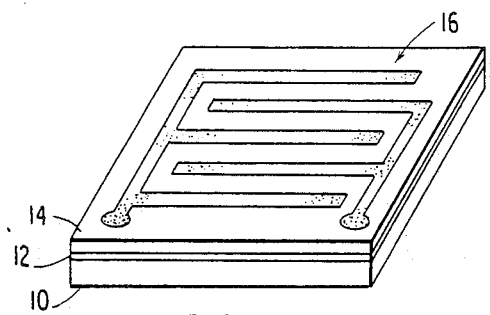
FIG. 1 is a perspective view of a film structure in accordance with one embodiment of this invention.

Referring now to FIG. 1, a perspective view of a thin film structure in accordance with this invention is depicted. The structure comprises a conductive substrate 10 having a layer of a relatively low dielectric constant thin film deposited thereon. This material is typically $SiO_2$, Silicon Nitride, BN or a polyimide with a dielectric constant of $\Sigma < 10$. Following deposition of the relatively low dielectric constant film 12, a high dielectric constant piezoelectric film 14 is deposited thereon. Such films are well-known in the art. Examples are Barium Titanite, PZT and PLZT or any other piezoelectric material capable of deposition in thin film form. The dielectric constant for this film should in general be $\Sigma > 500$.

An interdigital electrode array 16 is deposited on the piezoelectric film layer 14. Deposition of the metallic electrode pattern can be done in a manner known in the art. As illustrated in FIG. 1, the array is interdigited such that the fingers tend to interlock. Not illustrated is the external conductors for purposes of actuating a selected electrode.

The low dielectric constant film 12 provides a low voltage drop through the thickness of the high dielectric constant piezoelectric film 14. The dielectric film 12 also serves to isolate the bottom of the piezoelectric film from the conductive substrate 10. Thus, a relatively uniform electric field may be achieved across the interdigital gap (between electrodes) inside the piezoelectric film. As can be appreciated, if the low dielectric constant film 12 were eliminated the internal field in the piezoelectric material 14 would tend to be non-uniform. When applying a voltage to the electrodes, such must be adjusted not to exceed the breakdown field of the dielectric film 12.

Figure 2:
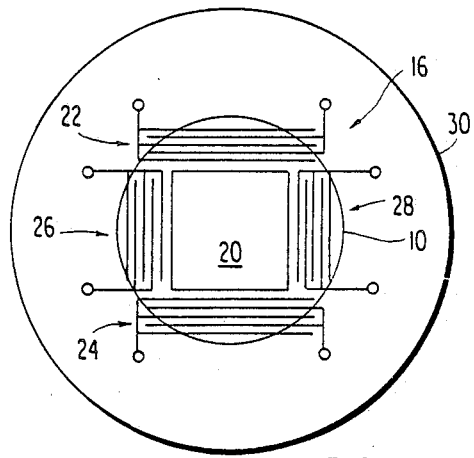
FIG. 2 is a plan view of an X-ray mask structure utilizing the film structure of FIG. 1.

Referring to FIG. 2, a first embodiment of the invention is depicted. FIG. 2 is a plan view of an X-ray mask. The overall membrane area 10 is illustrated having an X-ray exposure area 20 on a wafer 30. As illustrated in FIG. 2, there is no piezoelectric film in this area. The interdigital electrodes 16 as illustrated are placed orthogonal to each other to allow for x-y magnification correction. Thus, as illustrated in FIG. 2, the interdigital electrodes take the form of four sets, each set comprising a pair of electrodes as illustrated in FIG. 1. The sets 22 and 24 when actuated provide for correction in the x-y direction while the sets 26 and 28 provide for correction in the X-direction. Terminals for each of the electrodes are illustrated. As can be appreciated, to minimize processing steps, the structure illustrated in FIG. 2, together with the interdigital electrodes, can be processed at the same time as the absorber pattern.

There is generally a small gap, in the order of 40 microns between the mask and wafer. Electrical contact to the interdigital electrodes is accomplished by means of the conductive electrodes accessed from the side or the rear of the mask structure, through this gap.

Not illustrated are the control electronics which provide for independent actuation of each of the interdigital electrodes 22–28. Such techniques of individual actuation of electrode sets are known in the art. By selectively applying a voltage to any of those electrode patterns, movement of the piezoelectric film occurs such that x-y correction of magnification errors results. By the use of the interdigital electrodes, a transverse electric field is set up in the film, however, it is uniform across the interdigital gap to exist inside the piezoelectric film. This uniformity is achieved by the presence of the low dielectric constant thin film layer 12.

While illustrated in FIG. 2 as placed on the top of the membrane, it is apparent that the piezoelectric film and the electrodes may be placed on the bottom of the membrane or, if appropriate, on both top and bottom surfaces of the membrane. The decision on placement is a function of the extent to which magnification errors exist such that multiple interdigital electrode array structures are required to provide the necessary compensation.

Thus, by placing the film structure on both sides of the membrane in a sandwich-like arrangement, film stress is minimized. In that construction, the films are deposited symmetrically on both sides of the membrane with the interdigital electrodes placed orthogonal to each other.

In a second embodiment of this invention, the interdigital electrode structure 16 can be formed using a low X-ray absorption material and placed in the X-ray exposure area 20. This would enhance the dimensional change which can be effectuated. In this embodiment, the interdigital electrodes would be made using approximately 1000 Å of Al to provide a very low X-ray absorption pattern. In such an embodiment, the thickness of the piezoelectric film 14 would have to be thin enough to provide for the required dimensional change given the voltage constraints on the interdigital electrode pattern. Such could be accomplished if the X-ray absorption of the piezoelectric material was small enough and would be subjected to minimal radiation damage.

In such a configuration it is possible to independently adjust sections of the substrate with an appropriately addressed electrode array. This provides for flexibility in terms of localized compensation for magnification errors directly in the X-ray exposure area.

Figure 3:
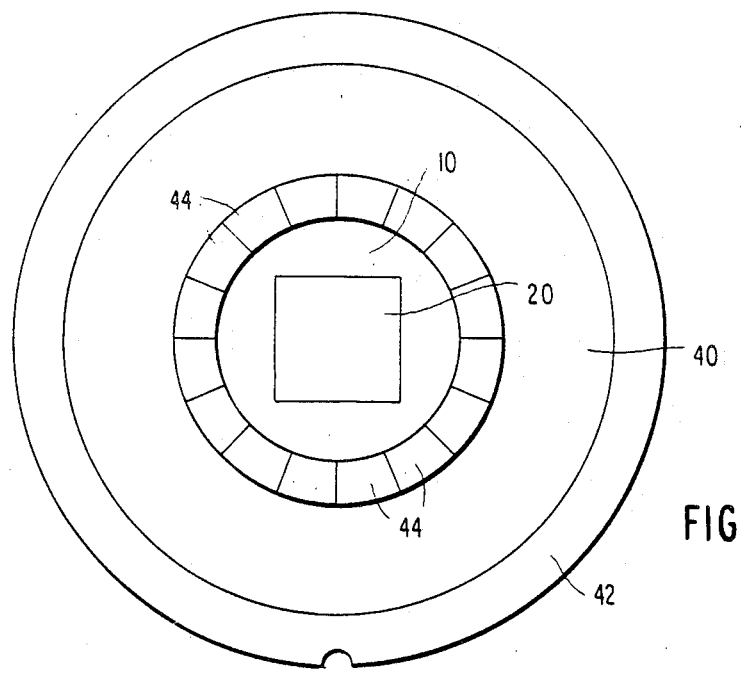
FIG. 3 is a plan view of a second embodiment of an X-ray mask structure using a ring of independently addressed correcting films.

Referring now to FIG. 3 a third embodiment of this invention is depicted. The wafer to be patterned is placed on a wafer frame 40 which in term is held on a mounting ring 42. As in the case of the FIG. 2 embodiment a membrane area 10 has an X-ray exposure area 20 where patterning is to take place. In this embodiment however, a series of independently addressed correcting film segments 44 are placed in a circle around the pattern area 20. This arrangement permits not only orthogonal correction by actuation of opposed segments along the x and y axes but also any other directional correction to control skew in mask dimensions. Such is accomplished by actuation of any or combinations of the correcting films 44 in the circle to correct for misalignment in any direction. As illustrated, in this embodiment the interdigital electrode pattern for each of the independently addressed correcting films 44 is oriented on the bias relative to the principle axes of the patterned area. This permits the application of the deformation force to the membrane along a radial line to minimize stresses on the structure. It will be understood that by selectively accessing the films selected planar deformation pattern can be achieved.

As in the case of the other embodiments each of the correcting film segments is independently addressable. This embodiment therefore permits movement of the piezoelectric film radially along n-radial lines where n is the number of circumferential segments.

While the invention has been described with respect to its preferred embodiments, it is apparent that other modifications of the invention may be practiced without departing from the scope of this invention. For example the low dielectric material can be removed when the X-ray mask is non-conductive.

I claim:

1. A thin film structure for correcting magnification errors in an X-ray lithography structure comprising:
   a conductive substrate a low dielectric constant thin film deposited on one surface of said substrate, a piezoelectric film deposited on said low dielectric constant thin film, and an electrode array positioned on said piezoelectric film to provide a relatively uniform electric field across the electrode array in said piezoelectric film.

2. The structure of claim 1 wherein said low dielectric constant film has a dielectric constant of $\Sigma < 10$.

3. The structure of claim 2, wherein said low dielectric constant film is selected from the group consisting of silicon dioxide, silicon nitride, and boron nitride.

4. The structure of claim 2, wherein said low dielectric constant film comprises a polyimide.

5. The structure of claim 1 wherein said piezoelectric film has a dielectric constant of $\Sigma > 500$.

6. The structure of claim 1 wherein said low dielectric constant film and said piezoelectric film are deposited on opposite surfaces of said substrate.

7. The structure of claim 1, wherein said electrode array comprises a pair of spaced interdigital electrodes, whereby an interdigital gap exists between electrodes to set up an electric field therein for locally exciting said piezoelectric film.

8. The structure of claim 1, wherein said electrode array comprises two sets of arrays, arrays in each set placed in a spaced relationship to each other, and the arrays in one set placed orthogonal to the arrays in the other set.

9. The structure of claim 8, wherein said sets of arrays are positioned outside an X-ray exposure area.

10. The structure of claim 1, wherein said electrode array comprises a ring of independently addressable thin film elements placed around and outside an X-ray exposure area.

11. An error correcting structure for eliminating misregistration between a mask and a wafer in submicron lithography, comprising:
    a conductive substrate having a two layer thin film composite deposited on one surface, said thin film composite comprising a low dielectric constant film adjacent to said surface and a high dielectric piezoelectric film deposited thereon, and an electrode array deposited on said piezoelectric film to locally excite said piezoelectric film by the application of a uniform electric field across said electrode array to adjust the position of said mask relative to said wafer.

12. The structure of claim 11, wherein said low dielectric constant film has a dielectric constant of $\Sigma < 10$.

13. The structure of claim 12, wherein said low dielectric constant film is selected from the group consisting of silicon dioxide, silicon nitride, and boron nitride.

14. The structure of claim 12, wherein said low dielectric constant film comprises BN.

15. The structure of claim 11, wherein said piezoelectric film has a dielectric constant of $\Sigma > 500$.

16. The structure of claim 11, wherein said low dielectric constant film and said piezoelectric film are deposited on opposite surfaces of said substrate.

17. The structure of claim 11, wherein said electrode array comprises a pair of spaced interdigital electrodes, whereby an interdigital gap exists between electrodes to set up an electric field therein for locally exciting said piezoelectric film.

18. The structure of claim 11, wherein said electrode array comprises two sets of arrays, arrays in each set placed in a spaced relationship to each other, and the arrays in one set placed orthogonal to the arrays in the other set.

19. The structure of claim 18, wherein said sets of arrays are positioned outside an X-ray exposure area.

20. The structure of claim 11, wherein said electrode array comprises a ring of independently addressable thin film elements placed around and outside an X-ray exposure area.

* * * * *